United States Patent [19]

Worthington

[11] 4,180,778
[45] Dec. 25, 1979

[54] DIGITAL SIGNAL PHASE SHIFTING SYSTEM

[75] Inventor: James C. Worthington, Binghamton, N.Y.

[73] Assignee: The Singer Company, Binghamton, N.Y.

[21] Appl. No.: 870,272

[22] Filed: Jan. 18, 1978

[51] Int. Cl.$^2$ ............... H03K 5/15; H03K 5/153; H03K 5/159; H04N 5/04

[52] U.S. Cl. ................................. 328/155; 328/55; 235/92 PS; 358/149

[58] Field of Search ................... 328/155, 140, 62, 63, 328/55; 358/149; 235/92 PS

[56] References Cited

U.S. PATENT DOCUMENTS

| | | | |
|---|---|---|---|
| 3,200,340 | 8/1965 | Dunne | 328/63 |
| 3,629,503 | 12/1971 | Rempert | 328/155 X |
| 3,790,710 | 2/1974 | Gaucheron | 358/149 |
| 3,833,854 | 9/1974 | Schunover | 328/155 |

Primary Examiner—John S. Heyman
Attorney, Agent, or Firm—J. Dennis Moore; Linn J. Raney; Jeff Rothenberg

[57] ABSTRACT

A digital signal phase shifting system which comprises a timing signal generator producing cyclic digitally coded timing signals; a first system output signal generator capable of decoding the timing signals and producing first system output signals in response to the occurrences of predetermined timing signals; a second system output signal generator capable of decoding digitally coded signals and producing a group of second system output signals in response to operation of the timing signal generator; and a setting device adjustable by the user to condition the second system output signal generator to shift the phase of the group of second system output signals.

13 Claims, 1 Drawing Figure

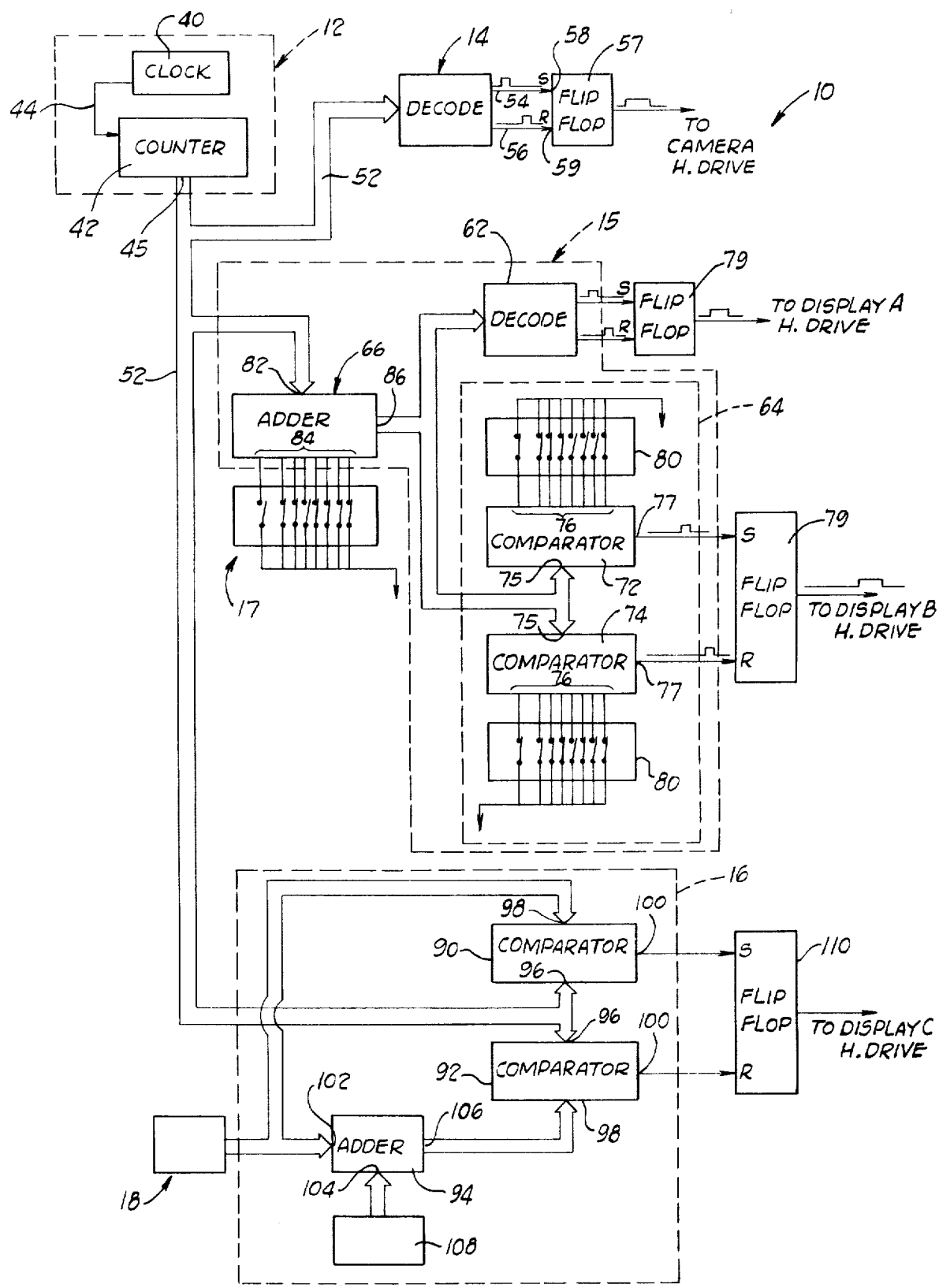

DIGITAL SIGNAL PHASE SHIFTING SYSTEM

BACKGROUND OF THE INVENTION

1. Field of the Invention

The present invention relates to systems for producing multiple cyclic output signals having predetermined time relations to each other and more particularly to such systems wherein the times of occurrence of the signals during the cycles, i.e., their "phase" relationships, can be selectively shifted.

One typical environment for selective phase shifting of multiple signal pulses is in the production of the image from a single television camera on multiple, coordinated television displays so that each display screen exhibits a portion of the camera image.

In such systems the camera operation is generally controlled by two or more command signals, usually called drive pulses, which are cyclic, may have different durations and occur at different respective times in the cycle interval. Likewise each display may be controlled by multiple cyclic drive pulses which have different durations and occur at different respective times in the cycle.

Because a predetermined part of the camera image is depicted by each display, operation of each display must be closely and accurately coordinated with the other displays and with the camera itself. As an example of the criticality of the coordination required, in many circumstances the camera is located remotely from the displays and the very slight delay attendant the passage of electrical signals through transmission cables to the displays is sufficiently long to adversely affect the image quality. This delay in transmission through the cable is called "propagation delay."

In order to accommodate the display operation to the camera, the camera operating drive pulses must be coordinated with display drive pulses in accordance with the extent of propagation delay being presently experienced. This requires that the system user have the ability to change the phase relationship between the camera and display drive pulses. As noted, there may be a significant number of display and camera drive pulses and consequently each display drive pulse must be shifted in time relative to the appropriate camera drive pulses in order to avoid problems resulting from the propagation delay.

If multiple cameras are used and the propagation delay from one camera is different from that of another, the display drive pulses should be simultaneously, and virtually instantaneously, adjusted if coherent successive images from different cameras are to be displayed.

In addition to shifting the phase of multiple display drive pulses relative to a given camera drive phase it is sometimes necessary, or at least desirable, to simultaneously alter the durations of the display drive pulses. This is done, for example, when the sweep frequency of the display units is to be altered.

Another situation in which display unit drive signals must be altered with speed and accuracy is where a television camera image which is substantially smaller than the screen area of the display unit, or units, moves around relative to the display unit, or units.

2. The Prior Art

Techniques for advancing or delaying cyclical signal pulses relative to each other have been used in the past. Analog phase shifters have been proposed for use in advancing or delaying signal pulses relative to each other. In one such proposal a first drive pulse initiated operation of a voltage ramp generator whose output was connected to the input of an analog comparator. The other comparator input was connected to a reference voltage so that when the ramp generator output equaled the reference voltage the comparator changed stated thereby creating an output signal. The reference level was adjustable to alter the extent of delay of the comparator output.

The components of analog systems were accurate and stable only over narrow operating condition ranges and therefore the extent of the advance or delay was limited by the quality of the system components. The components also tended to pick up electrical "noise" which affected the extent of the delay unsatisfactorily. Thirdly it was found that the ramp generators cycled at frequencies which were too low for some applications.

Many of the shortcomings of the analog systems were found to be avoidable by the use of digital electronic systems. One such digital system is disclosed by U.S. Pat. No. 3,833,854 issued to Robert W. Schonover on Sept. 3, 1974. The Schonover patent discloses a clock driven counter comprising a number of flip-flops connected to form an asynchronous counter whose outputs are connected to an AND gate for controlling operation of a second counter. Both counters are run by a common clock and loading the "set" inputs on the second counter results in a "delay" of the second counter's output relative to the first counter's output.

Although the Schonover device overcomes some disadvantages of the analog phase shifting systems, that system did not enable simultaneous phase shifting of multiple signals. In some circumstances when multiple display drive pulses were shifted relative to a camera drive pulse it has been possible to inadvertantly extend or shorten display drive pulse durations sufficiently that damage to deflection signal amplifier circuitry in the displays tended to occur. Moreover the Schonover circuitry was not sufficiently fast acting to enable phase shifting within a single cycle. The Schonover system limited to one per cycle the number of delayed or advanced pulses which could be accommodated. If, for example, a three bit counter were used in the Schonover system a different output pulse drive from the second counter could be produced only after eight clock pulses were counted.

Thus, while the Schonover approach avoided many of the serious shortcomings of analog phases shifters it did not provide a means for instantaneous or simultaneous phase shifting of cyclic drive pulses relative to each other.

SUMMARY OF THE INVENTION

The present invention provides a new and improved system for shifting the phase of a group of cyclic output signals wherein phase shifting of the signals is accomplished simultaneously and substantially instantaneously.

In accordance with a preferred embodiment of the invention a phase shifting system is provided wherein digitally coded time signals are employed to control the generation of cyclic system output signals. The time signals are fed to the inputs of first and second output signal generators. One output signal generator puroduces a group (at least two) of pulsating cyclic output signals which can be adjustably shifted relative to output signals produced by the other signal generator.

In accordance with another important feature of the invention a system is provided wherein system output pulses can be simultaneously phase shifted with the time elapsing between the pulses remaining unaltered during or by the phase shifting.

These features make the use of systems embodying the invention particularly advantageous with multiple TV displays which depict a single coherent camera image on their screens. In such a system multiple system outputs are paired and fed to wave forming devices which produce desirably shaped TV camera and display drive signals. These drive signals may be in the form of digital pulses whose duration is determined by the time elasping between system output signal pulses being fed to the wave forming device. Command signals for governing operation of at least one TV camera and all of the displays are thus produced. The group of display controlling command signals can be phase shifted instantaneously relative to the camera controlling command signals without changing the duration of any command signals.

This capability not only enables all of the displays to remain synchronized with camera operations when, for example, different cameras are used causing concommitant propagation delay changes, but also assures that command signal responsive circuits in the displays do not tend to be overloaded or otherwise damaged by undesirable abrupt changes in the command signal durations.

In a preferred embodiment of the invention the new system includes a timing signal generator for producing digitally coded timing signals, a first system output signal generator for producing at least one cyclic output signal in response to generation of a predetermined timing signal, a second system output signal generator for producing a group of system output signals, and an adjustable setting device connected to an input of the second system output signal generator for conditioning the second output signal generator to produce multiple output signals which bear a selected temporal relationship to the predetermined timing signal. By adjusting the setting device all of the second system output signals are simultaneously phase shifted relative to the first system output signals.

In one form of the invention the second system output signal generator comprises at least a pair of digital signal responsive devices which are individually conditionable to produce an output pulse in response to a predetermined digitally coded input signal. The signal generator also includes a digital signal processor connected between the digital signal responsive devices and the timing signal generator. The setting device conditions the signal processor to produce digitally coded output signals which either lead or lag the occurrence of corresponding timing signals. Changing the setting signal applied to the processor shifts the phase of all the output signals from the second system output generator. More particularly the system output signals are produced by digital comparators which can be set by the user to produce an output signal when a predetermined binary coded signal is input to them. The processor is preferably formed by a binary adder which is effective to algebraically add the timing signal to the setting arrangement signal and produce a binary coded output which is fed to the output signal producing comparators.

In another output signal generator constructed according to the invention the second output signal generator comprises at least a pair of digital signal responsive devices which have inputs connected directly to the timing signal generator. The signal generator also includes a digital signal processor having an output connected to the setting input of one of the digital signal responsive devices and first and second inputs. The setting arrangement is connected to the setting input of the other signal responsive device and to an input of the processor. The processor is preferably formed by a digital adder and its output is a digitally coded representation of the algebraic sum of its inputs. Changing the output of the setting device shifts the phase of all the second system output signals.

Another important feature of the invention resides in the ability to perform phase shifting extremely quickly. The rate at which phase shifting can be accomplished is essentially limited to the rate at which the setting device can be operated to condition the signal generators. In this regard the setting device can be formed, for example, by an output of a digital computer which is sufficiently fast acting to enable multiple phase shifts during each cycle of operation of the system. This capability can have application in information fetching operations which have to be performed at high rates.

Other features and advantages of the invention will become apparent from the following detailed description of a preferred embodiment and from the drawing which forms part of the specification and which schematically illustrates a system, for producing multiple cyclic output signals constructed according to the invention.

DESCRIPTION OF A PREFERRED EMBODIMENT

A system 10 for producing multiple cyclic output signals wherein groups of the output signals can be individually phase shifted is illustrated in the drawing. The system 10 comprises a time signal generator 12 which produces digitally coded cyclic time signals; separate output signal generators 14, 15, and 16, respectively, which are independently responsive to the time signal generator 12 to produce respective groups of output signals; and setting devices 17, 18 for the signal generators 15, 16 respectively to enable the output signal from those generators to be phase shifted as desired by the system user.

Phase shifting systems embodying the invention can be utilized in any environment where simultaneous phase shifting of groups of output signals is desirable or necessary and for the purpose of illustration and description the system 10 is disclosed in relation to a television system of the sort where three TV display units are used to coherently display the image produced by a single TV camera. This kind of TV simulation is commonly used for simulating terrain etc. in vehicle simulators. Since the operations of the TV camera and displays are generally known, and do not form part of the invention, a simplified, schematic connection and relationship of the system 10 to the TV camera and displays (not illustrated but indicated by letters A, B and C) is described in order to facilitate understanding the invention.

The time signal generator 12 provides a time reference for the system output generators 14–16 and comprises a conventional digital clock 40 producing a continuous succession of individual clock pulses which are input to a digital counter 42 via an electrical interconnect 44. The digital clock may be constructed and arranged so that the frequency of its output signal can be controlled by the user. In a system of the character referred to the clock pulse frequency may typically be on the order of 7 megahertz.

The digital counter 42 may be of any conventional or suitable construction having an input for receiving the clock pulses and an output 45 producing a digitally coded signal representative of the number of clock pulses input to the counter. The counter contains a number of output pin connections (not shown) and the counter circuitry operates the output pins between two voltage levels. The output pins are collectively capable of representing binary numbers. For the purpose of this description eight pin connections are assumed to be provided at the counter output so that the time signals output from the generator 12 are formed by binary coded signals representative counted clock pulses from zero to 255. When the 256th code pulse is counted the counter output is reset to zero and another cycle of clock counts is begun. The system 10, because of its response to the counter output signals is cyclically operated and the system cycle rate, assuming a clock frequency of 7 MHz, is about 30 KHz.

The system output signal generator 14 produces at least one system output signal in response to the occurrences of predetermined timing signals generator outputs. The counter output 45 is connected via an electrical interconnect 52 to corresponding input pins (not shown) of the output signal generator 14. The preferred signal generator 14 is formed by suitable decoder components which produce system output signal pulses having a duration equal to one clock pulse in response to receipt and decoding of predetermined binary coded time signals on the interconnect 52 from the time signal generator. The signal pulses are output from the signal generator 14 on output lines 54, 56. The system output signal generator 14 produces each output pulse individually and is constructed and arranged to enable the user to alter the time elapsing between the output pulses by changing the time signals to which the decoder components respond.

The system 10 is illustrated as used with a TV camera and displays and the system output signals from the signal generator 14 are fed to a wave forming device 57 which produces a horizontal drive pulse for the TV camera. The device 57 is illustrated as a conventional flip-flop which initiates an output camera drive pulse when a system output pulse is delivered to its setting input 58 and terminates the camera drive pulse when a system output pulse is delivered to its reset input 59. The TV camera drive pulse thus has a duration determined by the interval between the system output pulses from the generator 14 and the drive pulse duration is adjustable by the system user as noted above. Representations of the output pulses and the resultant TV camera horizontal drive pulse wave form are indicated in the drawings.

Operation of a set-reset flip-flop is known within the art and details of its construction and operation are therefore not provided. It should be apparent that the flip-flop is not a necessity and that either or both output pulses from the generator 14 can be utilized to provide timing signals in an application of the system 10 other than a TV simulation environment referred to.

The system output signal generator 15 produces a group of system output signal pulses in response to operation of the timing signal generator 12. The illustrated signal generator 15 includes a pair of output signal pulse producing decoder units 62, 64, each producing two output pulses and a processor unit 66 for receiving and processing the timing signal generator output to provide a binary coded output to the decoder units 62, 64.

The decoder units 62, 64 are identical and only the unit 64 is described. The decoder unit 64 comprises two digital comparators 72, 74 each having two inputs 75, 76 and one output 77. Each compares the digital signal input to its "setting" input 76 with the digital signal input from the processor unit to its input 75. When the comparator inputs are identical, that is, when the binary coded digital input signals represent the same number, a system output pulse is produced by the comparator. The system output pulses each have the same duration as one clock pulse.

The inputs 75, 76 of the comparators are each formed by eight separate pin connections (not illustrated) to enable the comparators to decode binary coded signals representative of numbers from zero to 255.

The set inputs of the comparators are each associated with a respective digital switch 80 which is manually set by the user to connect predetermined input pins to a suitable power supply and thereby control the time of production of the system output pulse produced by the comparator. The switches 80 can be of any known or suitable construction and are therefore schematically shown and not described in detail.

In the preferred embodiment of the invention the output signal generator 14, referred to above, is constructed identically to the decoder 64.

The output signal pulses from the comparators 72, 74 are fed to respective set and reset terminals of a flip-flop 79 which in turn produces a horizontal drive pulse for controlling the horizontal sweep of an associated TV display. The flip-flops 79 are identical to the flip-flop 57 referred to above.

The preferred processor unit 66 is formed by a digital adder having two inputs 82, 84 and an output 86 which is connected to both decoder units 62, 64. The adder inputs and output are each formed by eight pin connections to enable the adder to receive and transmit binary coded signals representative of numbers from zero to 255. The adder input 82 receives the binary signal output from the timing signal generator 12 via the interconnect 52. The adder may be of any suitable or conventional construction and is not illustrated or described in detail. The output pulses from the system output signal generator 15 can be phase shifted relative to the signals output from the generator 14 simultaneously. To this end the setting device 17 is associated with the adder input 84 for supplying an adjustable binary coded signal to the adder. The adder is effective to algebraically sum the binary signals input to it and produce an output signal to the decoder units 62, 64 which is representative of the sum of the members represented by the adder input signals. The setting unit 17 is schematically illustrated as a manually operable setting switch which connected between a suitable power supply and the adder input 84 and controlled by the user. The setting device can be of any desired construction.

By changing the setting input to the adder the system output pulses are simultaneously phase shifted without altering their time relationships to each other. This assures that the drive pulses output from the flip-flops 79 can be phase shifted relative to the camera drive pulses simultaneously without changing the duration of either of the display drive pulses output from the flip-flops 79.

The output signal generator 15 can be constructed using any reasonable number of the decoder units so that drive pulses for controlling additional displays can be produced. In practice the user of the system sets the individual comparator setting switches 80 so that the time relationship between the occurrences of the respective display drive pulses, as well as the duration of each such pulse, are coordinated as desired. The setting device 17 is then adjusted to coordinate the phase of the display drive pulses with the camera drive pulses. If a different camera is used which exhibits a greater or lesser degree of propagations delay all of the display drive pulses can be simultaneously phase shifted to accommodate the new camera merely by adjusting the setting device 17.

The output signal generator 16 is also effective to enable simultaneous phase shifting of its output signals pulses relative to the output signal pulses from the output signal generator 14. The preferred signal generator 16 comprises a pair of digital comparators 90, 92 and a digital signal processor 94.

The comparators 90, 92 each have an input terminal 96 connected to the timing signal generator output 45 via the interconnect 52, a setting input terminal 98 and an output terminal 100. The comparators produce individual output signal pulses from the terminals 100 when the binary coded signals to both of their respective input terminals are identical. The output pulses from the terminals 100 each have a duration of one clock pulse.

The processor 94 is preferably a binary adder having input terminals 102, 104 and an output terminal 106. The input terminal 102 is connected to a manually operated setting switch 108 (which can be identical to the switches 80 referred to above) and the output terminal 106 is connected to the setting input terminal of the comparator 92.

The setting device 18 adjustably controls the time in each cycle at which the respective signal pulses from the comparators 90, 92 are produced. The preferred setting device 18 is connected to the adder input terminal 102 and to the input terminal 98 of the comparator 90. The device 18 is set to produce a predetermined binary coded output signal which is input to both the comparator 98 and the adder 94. The output from the adder 94 is a binary coded signal representing the algebraic sum of the binary coded signals at the adder inputs. Assuming a signal representing a positive number is input to the adder input 104, it should be apparent that the signal input to the comparator 92 from the adder represents a larger number than the signal input to the comparator 90 from the setting device. Accordingly as the timing signal generator produces output signals during each cycle the comparator 90 produces an output signal pulse when the signal at its inputs are equal, while the comparator 92 produces a subsequent output signal pulse when the signals at its inputs are equal. The interval between the pulses is determined by the switch 108. Changing the signal produced by the setting device 18 alters the time in each cycle that the output signal pulses are produced without changing the interval between them.

In the preferred construction the output pulses from the comparators 90, 92 are fed to respective set and reset terminals of a flip-flop 110 which, in turn, produces an output drive pulse having a duration determined by the interval between the comparator output pulses. Changing the output of the setting device 18 thus changes the time in the cycle at which the drive pulse is produced but not the duration of the drive pulse.

The setting device 18 can be a manually operated switch like the switches 80 referred to above, or can be formed by the output of a digital computer if extremely rapid changes in the output from the device 18 are desirable. Rapid changes in the output from the device 18 can permit the generators of multiple output pulses within a given cycle of operation of the counter 42 and can be of importance in information fetching when applied to computer systems.

While the system 10 has been illustrated and described as including both the output signal generators 15 and 16 it should be apparent that a system embodying the invention can be constructed utilizing only one or the other of these output signals generators. Moreover it may also be desirable, in some circumstances, to utilize a signal generator 16 and associated setting device 18 in place of a decoder in the output signal generator 15. Such a replacement would provide additional flexibility to the phase shifting capability of the signal generator 15.

While only a single system including alternative phase shifting output signal generators embodying the invention has been illustrated and described, the present invention is not to be considered limited to the precise constructions disclosed. Various adaptations, modifications and uses of the invention may occur to those skilled in the arts to which the invention relates and it is the intention to cover all such adaptations, modifications and uses which fall within the scope and spirit of the claims.

What is claimed is:

1. A system for producing multiple cyclic output signals occurring at intervals which are adjustably variable comprising:
   (a) a timing signal generator having an output producing cyclic digitalized timing signals;
   (b) a first system output signal generator having an input connected to said timing signal generator output and at least one output forming a first system output, said first system output signal generator producing at least a first system output signal in response to the occurrences of a predetermined timing signal generator output;
   (c) a second system output signal generator having a first input receiving said timing signal generator output, a second input, and a plurality of outputs defining second system outputs; and
   (d) setting means connected to said second input of said second system output signal generator, said setting means producing an adjustable setting signal conditioning said second output signal generator to produce said plurality of second system output signals in response to occurrences of a timing signal generator output signal bearing a selected temporal relationship to said predetermined timing signal generator output signal.

2. The system claimed in claim 1 wherein said second system output signal generator comprises a processor unit and a decoder unit, said processor defining said first and second inputs and said decoder unit defining at least one of said second system outputs, said processor effective to process signals at said first and second inputs and transmit a resultant digitally coded signal to said decoded.

3. The system claimed in claim 2 wherein said timing signals are binary coded signals, said setting means provides a binary coded signal to said second input and said processor is defined by a binary adder effective to produce binary coded output representations corresponding to the algebraic sum of the signals input to said adder.

4. The system claimed in claim 3 wherein said decoder comprises first and second comparators each having a reference input, a setting input and an output, comparator setting means coacting with the setting input of each comparator for governing the binary adder output signal to which the respective comparators respond, said comparators producing separate output pulses.

5. The system claimed in claim 1 wherein said second system output signal generator comprises first and second digital comparators each having a reference input receiving said timing signals, a setting input and an output, and a digital processor having an output connected to the setting input of one of said comparators, said setting means connected to an input of said processor and to the setting input of said other comparator whereby one of said comparators produces an output dependant upon the timing signal and said setting means while the other comparator produces an output dependant upon the timing signal and the processor output.

6. A system for shifting the time of occurrence of at least two cyclic signals relative to a third cyclic signal comprising:
(a) time signal means for producing digitally coded cyclic time signals;
(b) an output signal generator means responsive to said time signals and effective to produce said third signals; and,
(c) second output signal generator means responsive to said time signals for producing said at least two cyclic signals, said second output signal generator means comprising at least first and second digital comparators each having a set input, a reference input and an output, a digital signal processor having an output associated with the input of at least one comparator, and setting means connected to a processor input for conditioning operation of the processor.

7. The system claimed in claim 6 wherein said processor output is connected to inputs of both comparators and a second input of said processor is connected to said time signal means, said comparators associated with respective comparator setting means whereby each comparator produces an output signal at a time dependent upon the processor output signal and the respective comparator setting means.

8. The system claimed in claim 6 wherein said setting means is connected to an input of the other of said comparators, said time signal means is connected to inputs of both comparators, and second setting means is connected to a second input of said processor, said first comparator producing an output signal occurring at a time dependent upon said time signal and the condition of said first and second setting means as reflected by the processor output, said second comparator producing an output signal occurring at a time dependent upon the condition of said first setting means and said time signal.

9. The system claimed in claim 8 wherein said setting means provides binary coded outputs and said processor is defined by a binary adder effective to produce an output reflective of the algebraic sum of said setting means outputs.

10. A system for generating a plurality of periodic pulse signals having controllably variable timing relationships therebetween comprising:
(a) timing signal means for producing a first cyclic series of digital timing signals;
(b) first output pulse means in association with said timing signal means for producing a first pulse signal in response to a first predetermined one of said digital timing signals in said series;
(c) second output means in association with said timing signal means for producing at least two pulse signals in response to at least a second and a third predetermined ones of said first digital timing signals, respectively, in said series;
(d) setting means in association with said second output pulse means for simultaneously controllably selecting at least said second and said third predetermined ones of said digital timing signals, whereby the timing relationship between said first pulse signal, and said second and third pulse signals together, is controllable by said setting means.

11. The system of claim 10 wherein said second output means comprises:
(a) at least two comparators, a first and a second, each responsive to two separate input digital signals and producing an output pulse when said separate digital signals are the same, each being connected at one input thereof to said timing signal means; and wherein said setting means comprises:
(b) processor means responsive to two separate input digital signals and producing a sum signal representative of their sum, and connected to the other input of said first comparator to supply said sum signal thereto;
(c) first switch means connected to the other input of said second comparator and to one input of said processor means, for providing a selectably controllable fixed digital signal thereto; and
(d) second switch means connected to the other input of said processor means for providing a selectably controllably fixed digital signal whereby said timing relationship is controllable by said first switch means.

12. A system for generating a plurality of periodic pulse signals having controllably variable timing relationships therebetween comprising:
(a) timing signal means for producing a first cyclic series of digital timing signals;
(b) first output pulse means in association with said timing signal means for producing a first pulse signal in response to a first predetermined one of said first digital timing signals in said series;
(c) second output pulse means in association with said timing signal means for producing at least two pulse signals in response to at least a second and a third predetermined ones of said first digital timing signals, respectively, in said series;
(d) setting means responsive to said first cyclic series of digital timing signals for producing a second cyclic series of digital timing signals corresponding to said first cyclic series but temporally shifted relative thereto, whereby the timing relationship between said first pulse signal and said second and third pulse signals together, is controllable by said switch means.

13. The system of claim 12 wherein said second output means comprises
  (a) at least two comparators, a first and a second, each responsive to two separate input digital signals and producing an output pulse when said separate digital signals are the same; and
  (b) at least two switch means, a first and a second, one for each of said comparators and connected to one input thereof, for providing selectably controllable fixed digital signals thereto; and wherein said setting means comprises:
  (c) third switch means for providing a selectable controllable fixed digital signal; and
  (d) processor means responsive to two separate input digital signals and producing a sum signal representative of their sum, having one input connected to said third switch means and the other to said timing signal means, and providing said sum signal to the other inputs of said comparators whereby said timing relationship is controllable by said third switch means.

* * * * *